US012646697B2

(12) United States Patent　　　(10) Patent No.: US 12,646,697 B2
Lee et al.　　　　　　　　　　　　　　(45) Date of Patent: Jun. 2, 2026

(54) PLASMA MONITORING SYSTEM AND METHOD OF MONITORING PLASMA

(71) Applicant: SAMSUNG ELECTRONICS CO., LTD., Suwon-si (KR)

(72) Inventors: Kwangho Lee, Suwon-si (KR); Sangki Nam, Suwon-si (KR); Jitae Park, Suwon-si (KR); Seongjin In, Suwon-si (KR); Keonhee Lim, Suwon-si (KR); Sungho Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 272 days.

(21) Appl. No.: 18/529,011

(22) Filed: Dec. 5, 2023

(65) Prior Publication Data

US 2024/0274419 A1　　Aug. 15, 2024

(30) Foreign Application Priority Data

Feb. 9, 2023　(KR) ........................ 10-2023-0017252

(51) Int. Cl.
　H01J 37/32　　　　(2006.01)
(52) U.S. Cl.
　CPC .. H01J 37/32972 (2013.01); H01J 37/32926 (2013.01)
(58) Field of Classification Search
　CPC ........... H01J 37/32972; H01J 37/32926; H01J 37/32917; H01J 37/244; H01J 37/153; H01J 37/32009; H01J 37/32119; H01J 37/32963; G01N 21/25; H01L 21/67011; H01L 21/67253; G01J 3/0208; G01J 3/0218; G01J 3/28
　See application file for complete search history.

(56) References Cited

U.S. PATENT DOCUMENTS

| | | | |
|---|---|---|---|
| 8,553,218 B2 | 10/2013 | Tinnemans et al. | |
| 9,970,818 B2 | 5/2018 | Bao et al. | |
| 10,107,681 B2 | 10/2018 | Kim et al. | |
| 10,215,704 B2 | 2/2019 | Han et al. | |
| 10,365,212 B2 | 7/2019 | Kueny et al. | |
| 11,092,495 B2 | 8/2021 | Mun et al. | |
| 2013/0141720 A1 | 6/2013 | Park et al. | |
| 2020/0319025 A1* | 10/2020 | Kim ...................... | G01J 3/0232 |
| 2022/0172928 A1 | 6/2022 | Ro et al. | |
| 2022/0336294 A1* | 10/2022 | Yang ...................... | H01L 22/12 |
| 2023/0078567 A1* | 3/2023 | Tae ........................ | G01N 21/59 |
| | | | 356/445 |

* cited by examiner

*Primary Examiner* — Thanh Luu
*Assistant Examiner* — Mai Thi Ngoc Tran
(74) *Attorney, Agent, or Firm* — Fish & Richardson P.C.

(57)　　　　　　　ABSTRACT

A plasma monitoring system includes a chamber with an internal space configured to perform a plasma process on a semiconductor substrate, the chamber including a view window and a substrate stage, a light transmitter on the view window and including optical fibers configured to obtain a first light generated during the plasma process, a detachable reflection mirror between the view window and the optical fibers, a light generator configured to irradiate a second light onto the reflection mirror through the optical fibers and to irradiate a third light onto the view window through the optical fibers, and a light analyzer configured to obtain a light spectrum from the first light, to correct the light spectrum based on the second light reflected from the reflection mirror, and to correct the light spectrum based on the third light reflected from the view window.

20 Claims, 10 Drawing Sheets

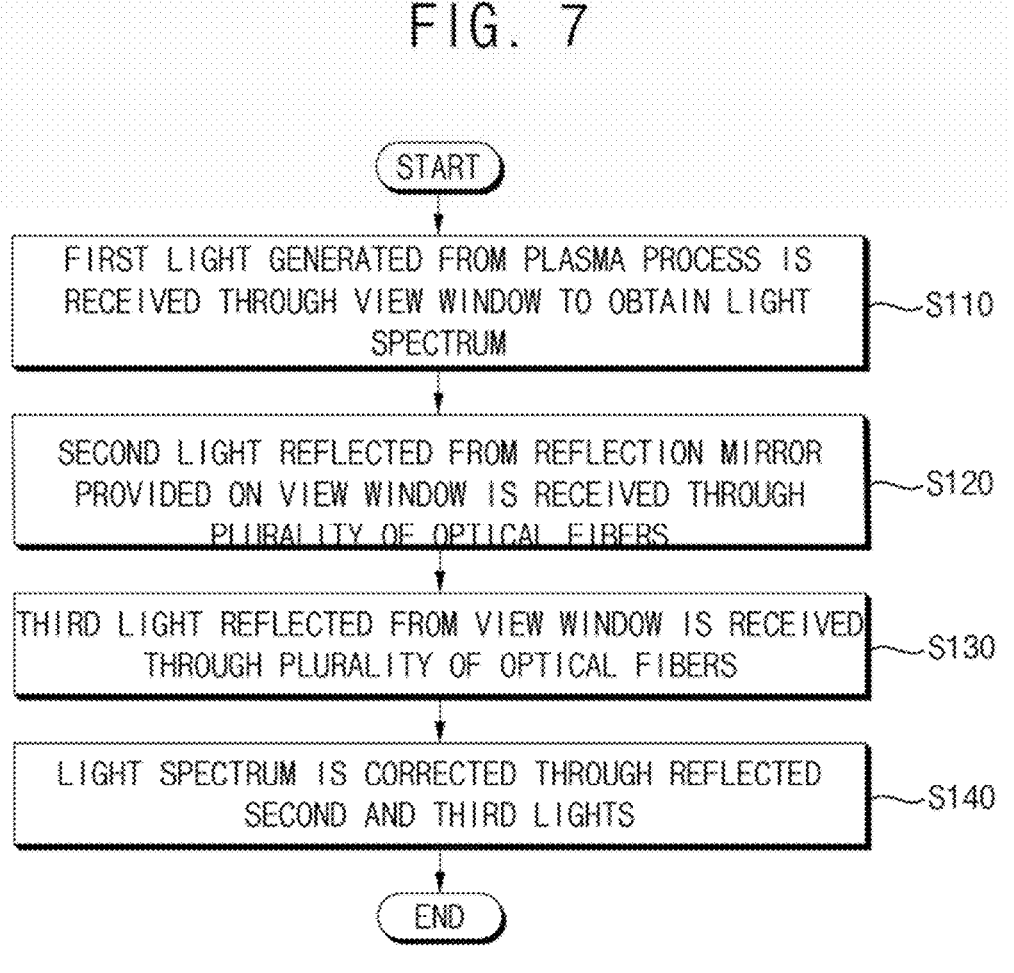

START

FIRST LIGHT GENERATED FROM PLASMA PROCESS IS RECEIVED THROUGH VIEW WINDOW TO OBTAIN LIGHT SPECTRUM — S110

SECOND LIGHT REFLECTED FROM REFLECTION MIRROR PROVIDED ON VIEW WINDOW IS RECEIVED THROUGH PLURALITY OF OPTICAL FIBERS — S120

THIRD LIGHT REFLECTED FROM VIEW WINDOW IS RECEIVED THROUGH PLURALITY OF OPTICAL FIBERS — S130

LIGHT SPECTRUM IS CORRECTED THROUGH REFLECTED SECOND AND THIRD LIGHTS — S140

END

PLASMA MONITORING SYSTEM AND METHOD OF MONITORING PLASMA

CROSS REFERENCE TO RELATED APPLICATION

This application claims priority under 35 U.S.C. § 119 to Korean Patent Application No. 10-2023-0017252, filed on Feb. 9, 2023, in the Korean Intellectual Property Office (KIPO), the contents of which are herein incorporated by reference in their entirety.

BACKGROUND

1. Field

Example embodiments relate to a plasma monitoring system and a method of monitoring plasma. More particularly, example embodiments relate a plasma monitoring system for checking a state of plasma in a chamber in which a plasma process is performed and a method of monitoring the plasma using the plasma monitoring system.

2. Description of the Related Art

In plasma processes of forming patterns on a semiconductor substrate, a state of plasma in a chamber may be checked in real time to improve reliability of the plasma process. Optical emission spectroscopy may analyze the state of the plasma by determining species of particles emitted by light irradiation. Spectrum data obtained through the optical emission spectroscopy may be affected by characteristics of process equipment and real time conditions, and thus, the spectrum data may be distorted. In order to minimize such distortion and increase data reliability, processes such as dark subtraction, wavelength calibration, flux calibration, etc., may be desired.

SUMMARY

According to example embodiments, a plasma monitoring system includes a chamber providing a space configured to perform a plasma process on a semiconductor substrate, the chamber including a view window and a substrate stage configured to support the semiconductor substrate, a light transmitter provided on the view window, the light transmitter including a plurality of optical fibers that are configured to obtain first light that is generated during the plasma process, a reflection mirror provided detachably between the view window and the plurality of optical fibers, a light generator configured to irradiate a second light onto the reflection mirror through the plurality of optical fibers and to irradiate a third light onto the view window through the plurality of optical fibers, and a light analyzer configured to obtain a light spectrum from the first light, to correct the light spectrum based on the second light reflected from the reflection mirror and to correct the light spectrum based on the third light reflected from the view window.

According to example embodiments, a plasma monitoring system includes a chamber providing a space configured to perform a plasma process on a semiconductor substrate, the chamber including a view window and a substrate stage configured to support the semiconductor substrate, a light transmitter provided on the view window, the light transmitter including a plurality of optical fibers that are configured to obtain first light generated from plasma during the plasma process, a reflection mirror detachably provided on the view window, the reflection mirror transmitting the first light that is incident from the view window, a light generator configured to irradiate a second light onto the reflection mirror through the plurality of optical fibers, the light generator configured to irradiate a third light onto the view window through the plurality of optical fibers, and a light analyzer configured to obtain a light spectrum from the first light, to correct the light spectrum based on the second light reflected from the reflection mirror, and to correct the light spectrum in real time during the plasma process based on the third light reflected from the view window.

According to example embodiments, in a method of monitoring plasma, a first light generated during a plasma process is received through a view window to obtain a light spectrum. A second light reflected from a reflection mirror provided on the view window is received through a plurality of optical fibers. A third light reflected from the view window is received through the plurality of optical fibers. The light spectrum is corrected through the reflected second and third lights.

BRIEF DESCRIPTION OF THE DRAWINGS

Features will become apparent to those of skill in the art by describing in detail exemplary embodiments with reference to the attached drawings, in which.

Figure 3:
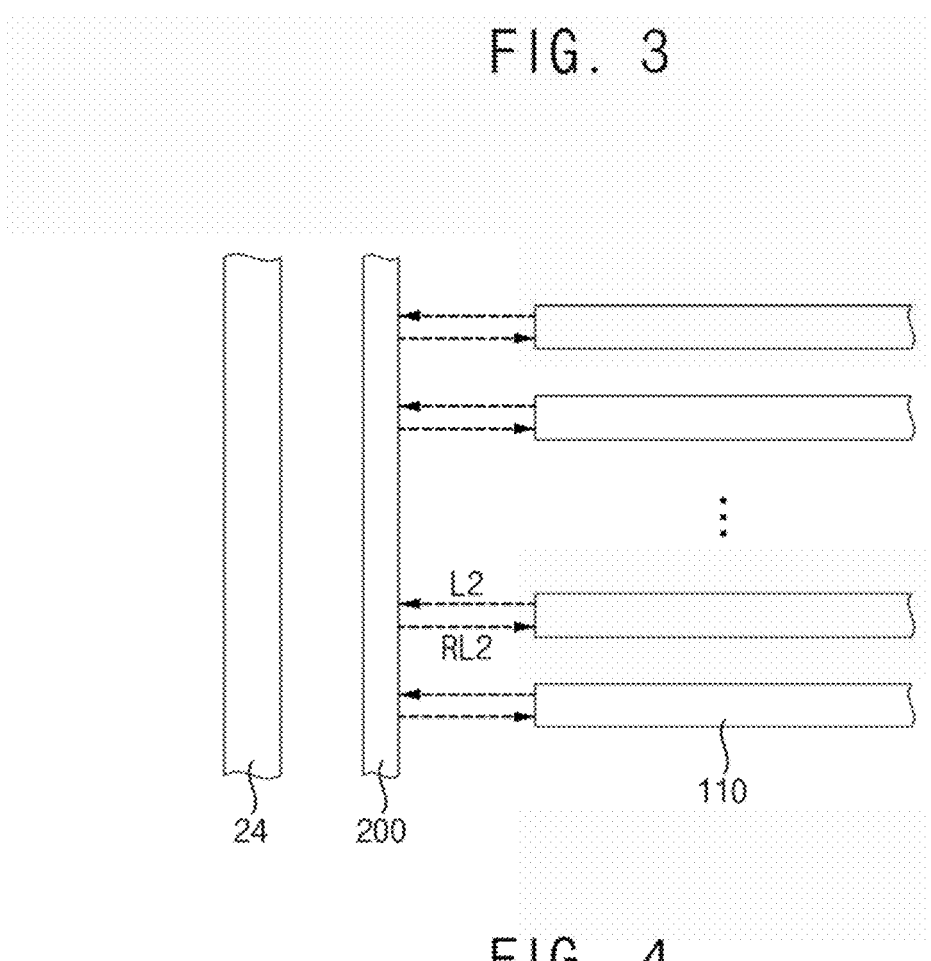
FIG. 3 is a view illustrating a process of obtaining a second reflected light reflected from a reflection mirror.

FIGS. SA to 5D are graphs illustrating a process of correcting a light spectrum of plasma through the second reflected light in FIG. 3.

Figure 4:
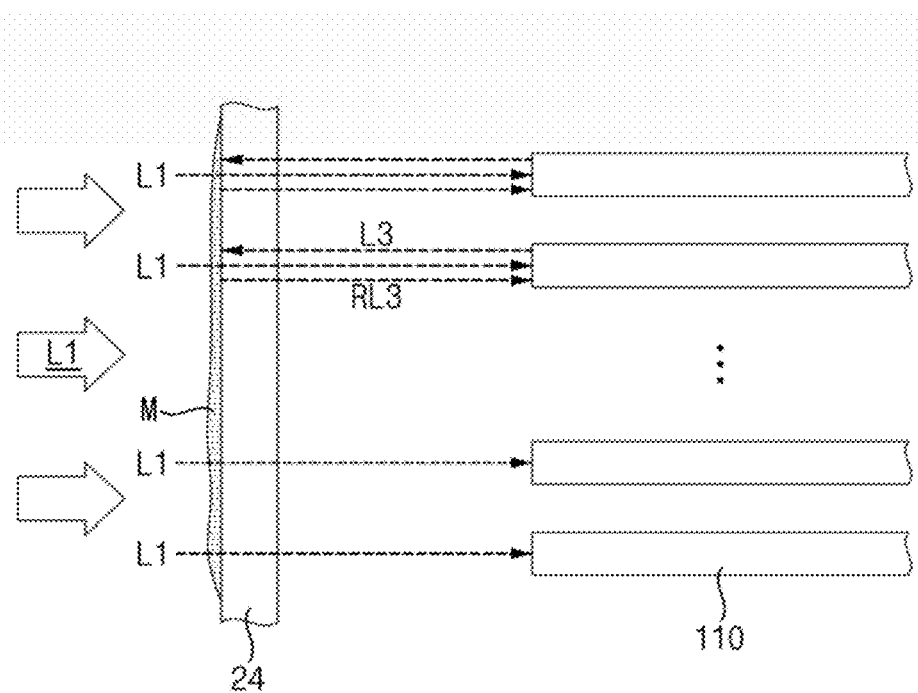
FIG. 4 is a view illustrating a process of obtaining a third reflected light reflected from a view window.

FIGS. 6A to 6D are graphs illustrating a process of correcting a light spectrum of plasma through the third reflected light in FIG. 4.

FIG. 7 is a flowchart illustrating a method of monitoring plasma in accordance with example embodiments.

DETAILED DESCRIPTION

Hereinafter, example embodiments will be explained in detail with reference to the accompanying drawings.

Figure 1:
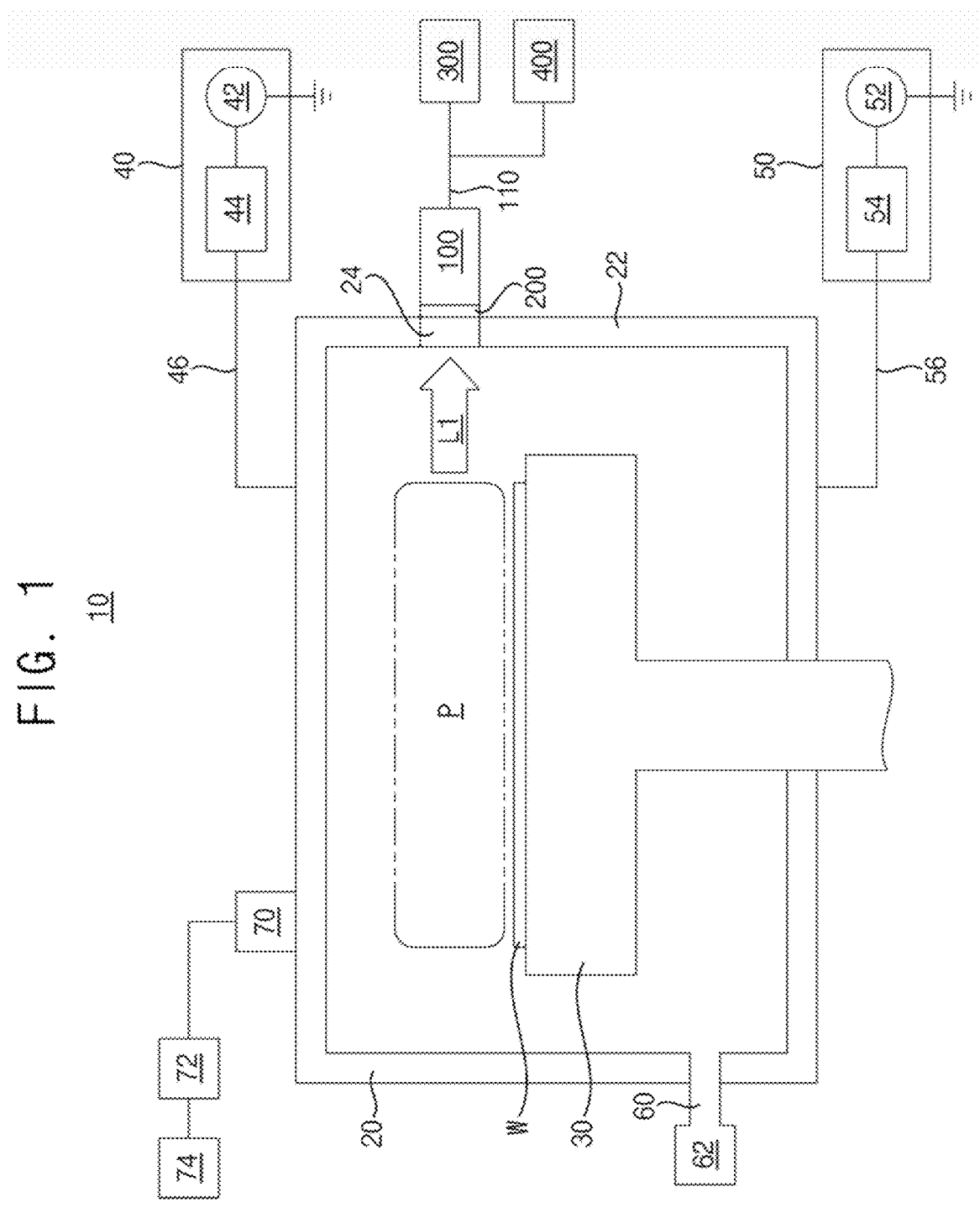
FIG. 1 is a schematic view of a plasma monitoring system in accordance with example embodiments.
Figure 2A:
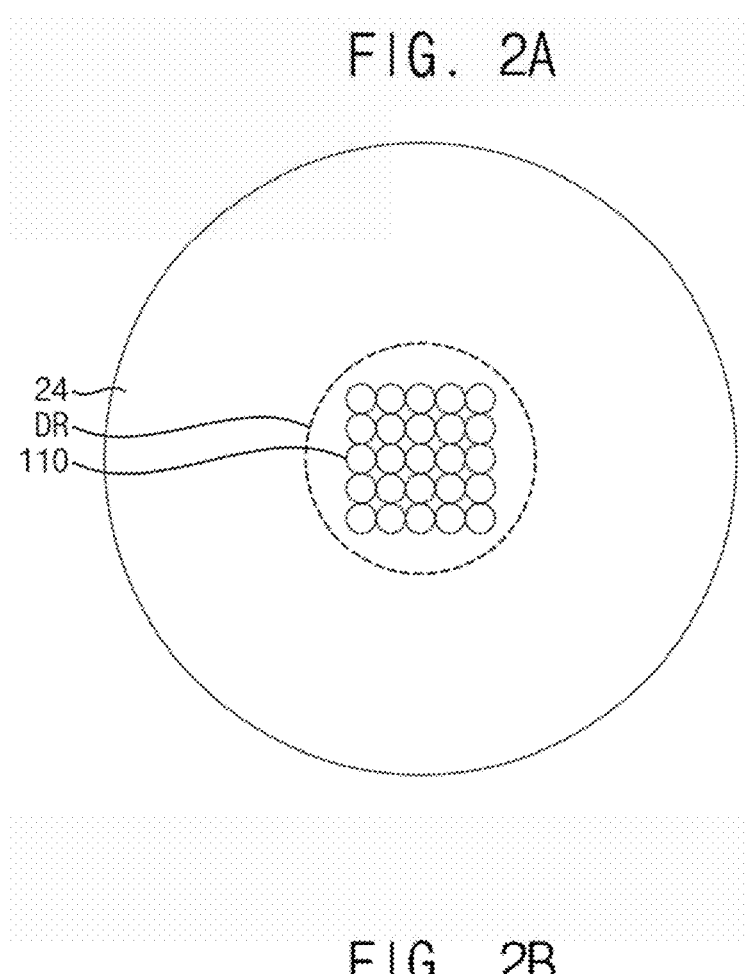
FIGS. 2A and 2B are schematic views of a plurality of optical fibers arranged on a view window.
Figure 2B:
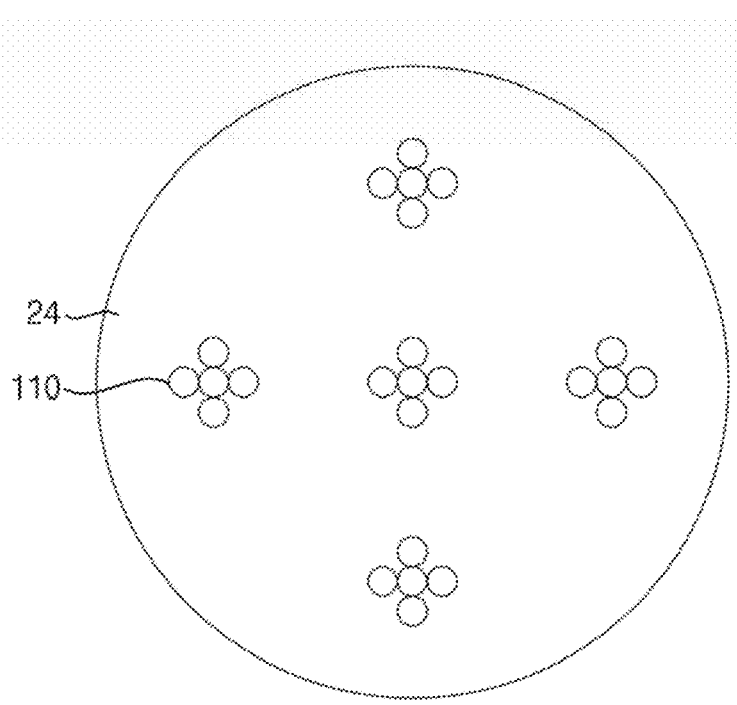

FIG. 1 is a view illustrating a plasma monitoring system in accordance with example embodiments. FIGS. 2A and 2B are views illustrating a plurality of optical fibers arranged on a view window. FIG. 3 is a view illustrating a process of obtaining second light reflected from a reflection mirror. FIG. 4 is a view illustrating a process of obtaining third light reflected from a view window. FIGS. 5A to 5D are graphs illustrating a process of correcting a light spectrum of plasma through the reflected second light in FIG. 3. FIGS. 6A to 6D are graphs illustrating a process of correcting a light spectrum of plasma through the reflected third light in FIG. 4.

Referring to FIGS. 1 to 6, a plasma monitoring system 10 may include a chamber 20 providing a space (e.g., an internal space) that is configured to perform a plasma process on a semiconductor substrate W and having a view window 24 (e.g., an optical window), a light transmitter 100 provided on the view window 24 to obtain a first light L1 that is generated from plasma P and having a plurality of optical fibers 110, a reflection mirror 200 detachably provided between the view window 24 and the plurality of optical fibers 110, a light generator 300 configured to generate a second light L2 that is irradiated onto the reflection mirror 200 and a third light L3 that is irradiated onto the view window 24, and a light analyzer 400 configured to correct a light spectrum that is obtained from the first light L1 through the second and third lights L2 and L3.

The plasma monitoring system 10 may correct the light spectrum that is obtained from the first light L1 through the second and third lights L2 and L3 that are generated by the light generator 300. The plasma monitoring system 10 may perform flux calibration and spectral reflectometry calibration on the light spectrum (e.g., the flux calibration gives quantitative meaning to the value of spectrum intensity by correcting the difference in sensitivity to wavelength caused by the difference in charge coupled device (CCD) characteristics).

The plasma monitoring system 10 may include a plasma processing apparatus for forming the plasma P on, e.g., above, a semiconductor substrate W in the chamber 20. The plasma monitoring system 10 may further include a substrate stage 30 in the chamber 20 to support the semiconductor substrate W on a seating surface thereof, and a state of the plasma P generated by the plasma processing apparatus may be determined.

The plasma processing apparatus may include a source power circuit portion 40 and a bias power circuit portion 50. The plasma processing apparatus may generate the plasma P through the source power circuit portion 40 and the bias power circuit portion 50.

For example, the plasma processing apparatus may be an apparatus that is capable of etching a target film on the semiconductor substrate, e.g., a semiconductor wafer, a glass substrate, etc., that is disposed in the chamber 20 for a plasma etching process. In another example, the plasma processing apparatus may be a deposition apparatus, a cleaning apparatus, etc.

For example, the plasma processing apparatus may be a capacitively coupled plasma (CCP) processing apparatus. In another example, the plasma generated by the plasma processing apparatus may be inductively coupled plasma (ICP) and microwave plasma.

The plasma etching process may refer to a process in which electromagnetic energy is applied to at least one precursor gas or precursor vapor to convert a precursor into reactive plasma. The plasma etching process may be used to etch materials, e.g., blanket dielectric films, on semiconductor devices, e.g., the semiconductor substrate W. For example, the plasma monitoring system 10 may be used to obtain information for determining an etch end point within the plasma etch process.

The electromagnetic energy may be applied to the precursor gas or the precursor vapor to generate the plasma P from the precursor. In a process of generating the plasma P, the plasma P may emit a wavelength. The first light L1 may be emitted when the plasma P is ionized.

In example embodiments, the chamber 20 may provide an enclosed space configured to perform the plasma process on the semiconductor substrate W. The chamber 20 may include a metal, e.g., aluminum or stainless steel. For example, the chamber 20 may be referred to as a plasma processing chamber that has a tuning electrode inside the substrate stage 30 for enhanced processing rate and plasma profile uniformity.

The substrate stage 30 configured to support the semiconductor substrate W may be provided in the chamber 20. For example, the substrate stage 30 may serve as a susceptor that is capable of supporting the semiconductor substrate W. The substrate stage 30 may include an electrostatic chuck that is capable of holding the semiconductor substrate W with an electrostatic adsorption force. The electrostatic chuck may adsorb and hold the semiconductor substrate with electrostatic power by a direct current voltage that is supplied from a direct current power source.

The semiconductor substrate W may be disposed on an upper surface of the electrostatic chuck, and a focus ring may be disposed around the semiconductor substrate W. A lower electrode may be disposed below the semiconductor substrate W. In addition, the lower electrode may include a circulation channel for cooling therein. Also, for precision of wafer temperature, a cooling gas, e.g., He gas, may be supplied between the electrostatic chuck and the semiconductor substrate W.

The chamber 20 may include the view window 24. The view window 24 may be provided on a side wall 22 of the chamber 20. The view window 24 may be provided to transmit light, and an internal space of the chamber 20 may be recognized from an outside through the view window 24. That is, the view window 24 may be referred to as a viewing mechanism for the chamber 20, and the view window 24 may include a transparent material, e.g., glass, quartz, fused silica, or sapphire depending on a chemical action of the plasma.

A gate may be provided on the side wall 22 of the chamber 20 to allow access of the semiconductor substrate W. The semiconductor substrate W may be loaded and unloaded onto the substrate stage 30 through the gate.

An exhaust port 60 may be installed in a lower portion of the chamber 20, and an exhaust portion 62 may be connected to the exhaust port 60 through an exhaust pipe. The exhaust portion 62 may include a vacuum pump, e.g., a turbo molecular pump, to adjust a processing space inside the chamber 20 to a desired vacuum level. In addition, process by products and residual process gases that are generated in the chamber 20 may be discharged through the exhaust port 60.

The source power circuit portion 40 may be electrically connected to an upper electrode. The upper electrode may be disposed above the chamber 20 to face the lower electrode. A chamber space between the upper electrode and the lower electrode may be used as a plasma generating region. The upper electrode may have a surface facing the semiconductor substrate W on the substrate stage 30.

An insulating shield member may support the upper electrode above the chamber 20. For example, the upper electrode may include a circular electrode plate. The upper electrode may have a plurality of supply holes through which gas is supplied into the chamber 20.

The source power circuit portion 40 may supply plasma source power to the upper electrode. The source power circuit portion 40 may be connected to the upper electrode through a first signal line 46. For example, the source power circuit portion 40 may include a high frequency generator 42 and a matcher 44 as plasma source elements. The high frequency generator 42 may generate a high radio frequency (RF) signal. The matcher 44 may match an output impedance of the RF signal that is generated from the high frequency generator 42 to control the plasma P through the upper electrode. The matcher 44 may control the output impedance by changing an internal capacitor.

In example embodiments, the substrate stage 30 may have the seating surface that is capable of supporting the semiconductor substrate W. For example, a conductor, e.g., an RF electrode, a clamping electrode, or a resistance heating element, may be provided on an inside or a surface of the substrate stage 30, and may serve as a heater or the electrostatic chuck.

The substrate stage 30 may include metallic or ceramic materials. For example, the metallic or the ceramic materials may include at least one of metals, metal oxides, metal nitrides, metal oxynitrides, or any combination thereof. The substrate stage 30 may include aluminum, aluminum oxide, aluminum nitride, aluminum oxynitride, or any combination thereof.

The bias power circuit portion 50 may be electrically connected to the lower electrode. The lower electrode may be disposed under the semiconductor substrate W. In addition, the lower electrode may have a circulation channel for cooling therein. The lower electrode may cool the semiconductor substrate W in contact with high temperature plasma.

The bias power circuit portion 50 may supply bias power to the lower electrode. The bias power circuit portion 50 may include a bias RF power supply 52 and a bias RF matcher 54 as bias elements. The bias RF power supply 52 may generate a bias RF signal. The lower electrode may attract plasma atoms or ions generated in the chamber 20 through the bias power circuit portion 50.

The bias RF matcher 54 may vary a capacitor of the lower electrode. For example, the bias RF matcher 54 may be connected to the lower electrode through a second signal line 56. The bias RF matcher 54 may include an electronic tuner and an electronic sensor that serve as a variable capacitor. The electronic sensor may be referred to as a voltage sensor or current sensor, and may be connected to the electronic tuner to control the plasma in the chamber 20.

In example embodiments, the plasma processing apparatus may further include a gas supply portion that is configured to supply gas into the chamber 20. For example, the gas supply portion may include gas supply pipes 70, a flow controller 72, and a gas supply source 74 as gas supply elements. The gas supply pipes 70 may supply various gases to top and/or side of the chamber 20. The gas supplied by the gas supply pipes 70 may be injected into the chamber 20 through a shower head. The shower head may directly inject the various gases into a plasma space P in the chamber 20.

The gas supply portion may supply different gases at a desired ratio. The gas supply source 74 may store a plurality of gases, and the gases may be supplied through a plurality of gas lines respectively connected to the gas supply pipes 70. The flow controller 72 may control a supply flow rate of the gases introduced into the chamber 20 through the gas supply pipes 70. The flow controller 72 may independently or commonly control the supply flow rates of the gases respectively supplied to a vertical gas supply pipe and a horizontal gas supply pipe.

For example, the gas supply source 74 may include a plurality of gas tanks, and the flow controller 72 may include a plurality of mass flow controllers (MFCs) respectively corresponding to the gas tanks. The plurality of mass flow controllers may independently control the supply flow rates of the gases.

In example embodiments, the reflection mirror 200 may be provided between the view window 24 and the plurality of optical fibers 110. The reflection mirror 200 may be detachably provided on the view window 24, e.g., the reflection mirror 200 may be a detachable reflective mirror that is separable (e.g., movable) from the view window 24 and the plurality of optical fibers 110.

The reflection mirror 200 may be disposed on the view window 24 in the process of performing the flux calibration. The reflection mirror 200 may be disposed on the view window 24 when the second light L2 is irradiated from the light generator 300 toward the view window 24. The reflection mirror 200 may reflect the second light 12 that is irradiated through the plurality of optical fibers 110 back toward the plurality of optical fibers 110 as a second reflected light RL2.

Since the second reflected light RL2 is reflected from the reflection mirror 200 without being irradiated to (e.g., without being incident on) the view window 24, the second reflected light RL2 may move only within the plurality of optical fibers 110 and the light analyzer 400. Sensitivity for each wavelength of the plurality of optical fibers 110 and the light analyzer 400 may be obtained through the second reflected light RL2 that moves only in the plurality of optical fibers 110 and the light analyzer 400 (e.g., for flux calibration purposes).

The reflection mirror 200 may be detached from the view window 24 in the process of performing the spectral reflectometry calibration. When the third light L3 is irradiated from the light generator 300, the reflection mirror 200 may be detached from the view window 24, e.g., so the third light L3 is incident directly on the view window 24. Since the reflection mirror 200 is detached from the view window 24 in the process of performing the spectral reflectometry calibration, the third light L3 irradiated from the plurality of optical fibers 110 may reach the view window 24.

In example embodiments, the light generator 300 may generate the second light L2 and the third light L3. The light generator 300 may transfer the second and third lights L2 and 13 to the plurality of optical fibers 110.

The light generator 300 may generate light of a predetermined wavelength according to a type of the plasma P to be measured. The light generator 300 may select and generate the predetermined wavelength from a broad band. Each of the second and third lights L2 and L3 may have the predetermined wavelength. For example, the light of the predetermined wavelength may include ultraviolet (UV) light, visible light, infrared (Mid-IR) light, near-IR (Near-IR) light, far-IR (Far-IR) light, and terahertz (THz) rays. For example, the light generator 300 may be an external light source that provides light pulses (e.g., a single mode of on/off pulse) as the second and third lights L2 and L3.

The light generator 300 may irradiate the second light L2 onto the reflection mirror 200 through the plurality of optical fibers 110. The second light L2 generated from the light generator 300 may be used to perform the flux calibration. The flux calibration may be referred to as a correction for reflecting the sensitivity for the wavelength of the light analyzer 400 or the optical fibers 110 to the light spectrum.

The light generator 300 may irradiate the third light L3 onto the view window 24 through the plurality of optical fibers 110. The third light L3 generated from the light generator 300 may be used to perform the spectral reflectometry calibration. The spectral reflectometry calibration may be referred to as a correction for reflecting reflectance and transmittance of the view window 24 to the light spectrum.

In example embodiments, the light transmitter 100 may be provided on the view window 24, e.g., the light transmitter 100 may be external with respect to the chamber 20. The light transmitter 100 may include the plurality of optical fibers 110 through which the light moves. The light transmitter 100 may obtain the first light L1 generated through the plasma process through the plurality of optical fibers 110. The plurality of optical fibers 110 may be disposed on the view window 24 according to characteristics of the view window 24. An arrangement of the plurality of optical fibers 110 may be changed to maximize a monitoring effect of the plasma monitoring system 10.

For example, as illustrated in FIG. 2A, the plurality of optical fibers 110 may be provided on a preset region DR of the view window 24. For example, the present region DR may be in a center of the view window 24, and the plurality of optical fibers 110 may extend, e.g., lengthwise, along a direction normal to the surface of the view window 24 including the preset region DR (e.g., into the page of FIG. 2A). For example, as further illustrated in FIG. 2A, all the plurality of optical fibers 110 may be grouped into a single group to contact each other and to be arranged in a matrix pattern. When the plurality of optical fibers 110 are provided on the preset region DR of the view window 24, the plurality of optical fibers 110 may obtain the first light L1 within the preset region DR. For example, the preset region DR may be referred to as an area in which a need to obtain the first light L1 from the plasma P is high.

In another example, as illustrated in FIG. 2B, the plurality of optical fibers 110 may be grouped to have a preset number on the view window 24. Groups of the plurality of optical fibers 110 may be provided to be spaced apart from each other on the, e.g., entire, view window 24. The groups of a plurality of optical fibers 110 may be provided to be distributed on the view window 24, e.g., at equal intervals. When the groups of the plurality of optical fibers 110 are distributed and provided on the view window 24, the plurality of optical fibers 110 may obtain the first light L1 in a wide area.

For example, the plurality of optical fibers 110 may include a multimode fiber. The plurality of optical fibers 110 may transmit the first to third lights L1, L2, and L3 that have guided modes through the multimode fiber. The plurality of optical fibers 110 may transmit reflected light that has a plurality of wavelengths through the multimode fiber. The multimode fiber may have high incidence efficiency through a large core.

As illustrated in FIG. 3, the light transmitter 100 may arrange first ends of the plurality of optical fibers 110 on the reflection mirror 200 in the process of performing the flux calibration, and second ends of the plurality of optical fibers 110 (opposite respective ones of the first ends) oriented toward the light generator 300. The first ends of the plurality of optical fibers 110 may be disposed toward the reflection mirror 200.

In the flux calibration, the light transmitter 100 may irradiate the second light L2 that is generated from the light generator 300 onto the reflection mirror 200 through the plurality of optical fibers 110. The light transmitter 100 may obtain the second reflected light RL2 reflected from the reflection mirror 200 through the plurality of optical fibers 110. The light transmitter 100 may transfer the second reflected light RL2 to the light analyzer 400 through the plurality of optical fibers 110.

As illustrated in FIG. 4, the light transmitter 100 may arrange the first ends of the plurality of optical fibers 110 on the view window 24, respectively, in the process of performing the spectral reflectometry calibration. The first ends of the plurality of optical fibers 110 may be disposed toward the view window 24.

In the spectral reflectometry calibration, the light transmitter 100 may irradiate the third light L3 that is generated from the light generator 300 onto the reflection mirror 200 through the plurality of optical fibers 110. The light transmitter 100 may obtain the reflected third light RL3 that is reflected from the view window 24 through the plurality of optical fibers 110.

The third light L3 may be incident on and reflected from a deposition material M formed on the view window 24 in, e.g., during, the plasma process. The deposition material M may be formed from the precursor gas or the precursor vapor in the plasma process, e.g., so the deposition material M may reflect contamination affecting light transmission in real time. The light transmitter 100 may transfer the third reflected light RL3 (reflected from the deposition material M) to the light analyzer 400 through the plurality of optical fibers 110.

The light transmitter 100 may obtain only the first light L1 in the process of performing the spectral reflectometry calibration. When the light generator 300 does not generate the third light L3, the light transmitter 100 may obtain only the first light L1 through the view window 24 (e.g., so the difference between the on/off states of the third light L3 allows to exclude the plasma signal and determine the third reflected light LR3).

In example embodiments, the light analyzer 400 may receive the first light L1 from the plurality of optical fibers 110 of the light transmitter 100. The light analyzer 400 may obtain the light spectrum from the first light L1. The light analyzer 400 may receive the second and third reflected lights RL2 and RL3 from the plurality of optical fibers 110 of the light transmitter 100. The light analyzer 400 may include an optical scanner that is configured to scan the first light L1, the second reflected light RL2, and the third reflected light RL3, and a spectrometer that is configured to obtain the light spectrums from the first light L1, the second reflected light RL2, and the third reflected light RL3, respectively.

The optical scanner may be provided at the second ends opposite to the first ends of the optical fibers 110. The optical scanner may capture the first light L1 that is generated from the plasma P. The optical scanner may capture the second and third reflected lights RL2 and RL3 reflected from the view window 24 and the reflection mirror 200, respectively. The optical scanner may have an imaging area capable of imaging the second ends of the optical fibers 110 of the light transmitter 100.

The spectrometer (e.g., a multi-channel imaging spectrometer) may obtain the light spectrum from the first light L1, the second reflected light RL2, and the third reflected light RL3 that are captured by the optical scanner from the plurality of optical fibers 110, respectively. For example, the light spectrum may have light intensities according to time. The spectrometer may include a time domain spectroscopy (TDS).

The light analyzer 400 may correct the light spectrum based on the second reflected light RL2 reflected from the reflection mirror 200. The light analyzer 400 may perform the flux calibration through the second reflected light RL2 reflected from the reflection mirror 200.

The light analyzer 400 may obtain the sensitivity for each wavelength of each of the plurality of optical fibers 110 and the light analyzer 400 from the second reflected light RL2. The light analyzer 400 may correct the light spectrum through the sensitivity for each wavelength of each of the plurality of optical fibers 110 and the light analyzer 400.

The light analyzer 400 may obtain a first light spectrum LS1 from the first light L1. The light analyzer 400 may obtain a second light spectrum LS2 from the second reflected light RL2. The difference between first light spectrum LS1 and the second light spectrum LS2 may be used to perform the flux calibration.

Figure 5A:
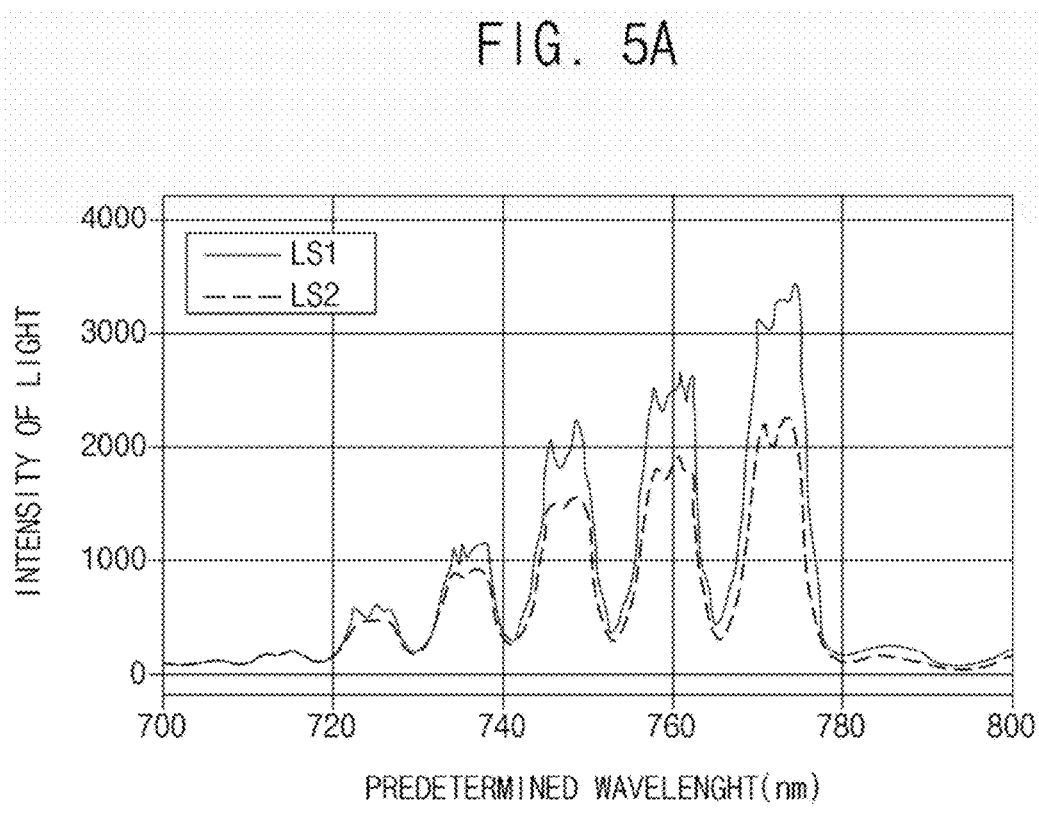

As illustrated in FIG. 5A, the first light spectrum LS1 may be obtained within various wavelength ranges. The second light spectrum LS2 may be obtained by changing the predetermined wavelength from the light generator 300. The first and second light spectrums LS1 and LS2 may have intensities according to the predetermined wavelength, respectively.

Figure 5B:
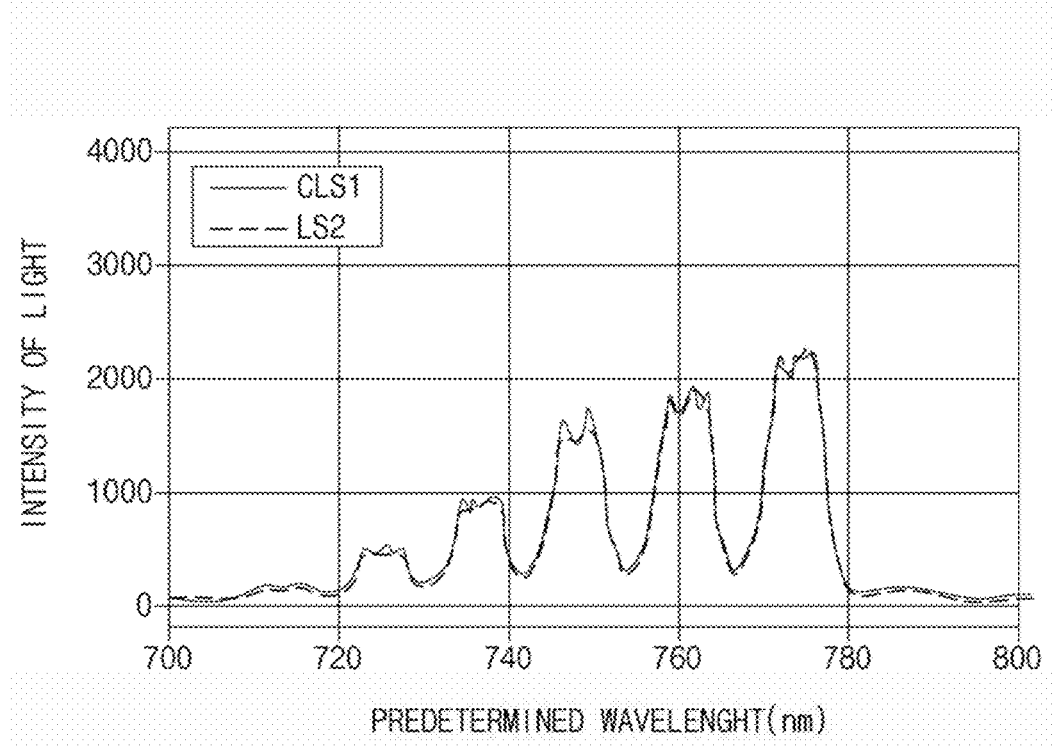

As illustrated in FIG. 5B, the first light spectrum LS1 may be corrected based on the reflectance of each wavelength of the reflection mirror 200 and the second light spectrum LS2. The corrected first light spectrum CLS1 may reflect the sensitivity for each wavelength of each of the plurality of optical fibers 110 and the light analyzer 400.

The light analyzer 400 may perform tool to tool matching (TTTM) of the light analyzer 400 from the second reflected light RL2. The light analyzer 400 may correct the light spectrum through the tool to tool matching of the light analyzer 400. The tool to tool matching may be referred to as an operation to increase a synchronization rate between the light analyzer 400 and the plasma processing apparatus.

Figure 5C:
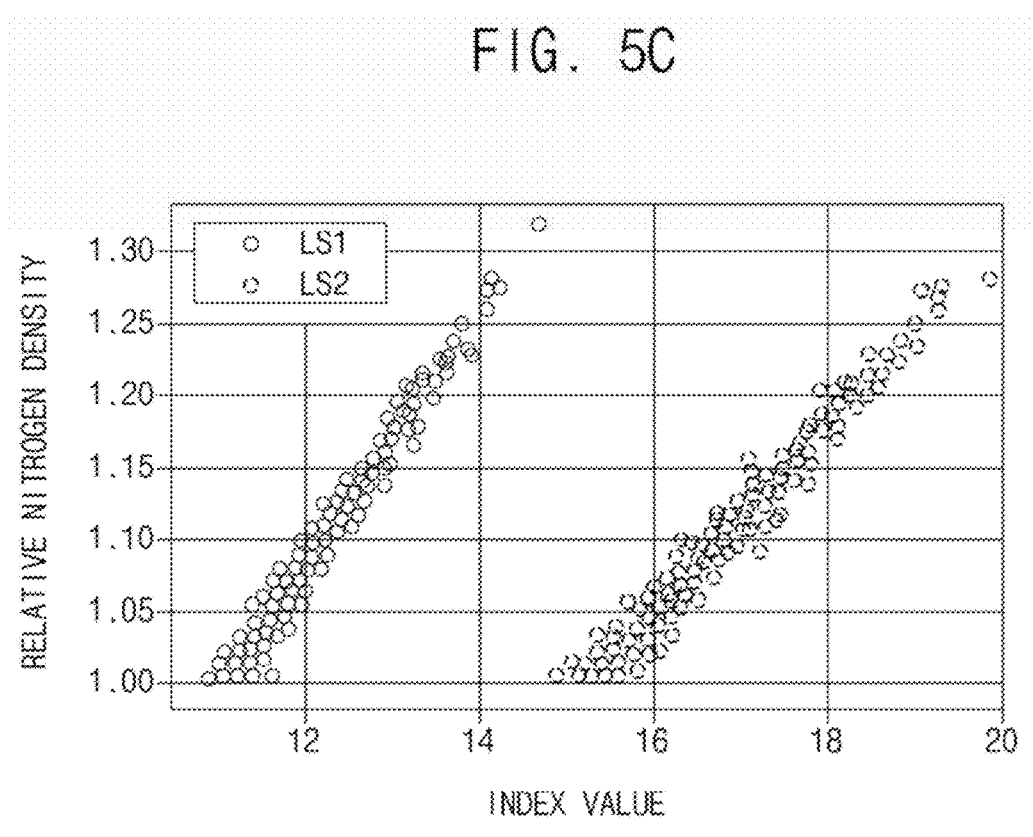

For example, as illustrated in FIG. 5C, a relative nitrogen density may be obtained from the first and second light spectra LS1 and LS2. The relative nitrogen density may be referred to as a nitrogen ratio in the chamber 20 that is obtained through the light spectrum.

Figure 5D:
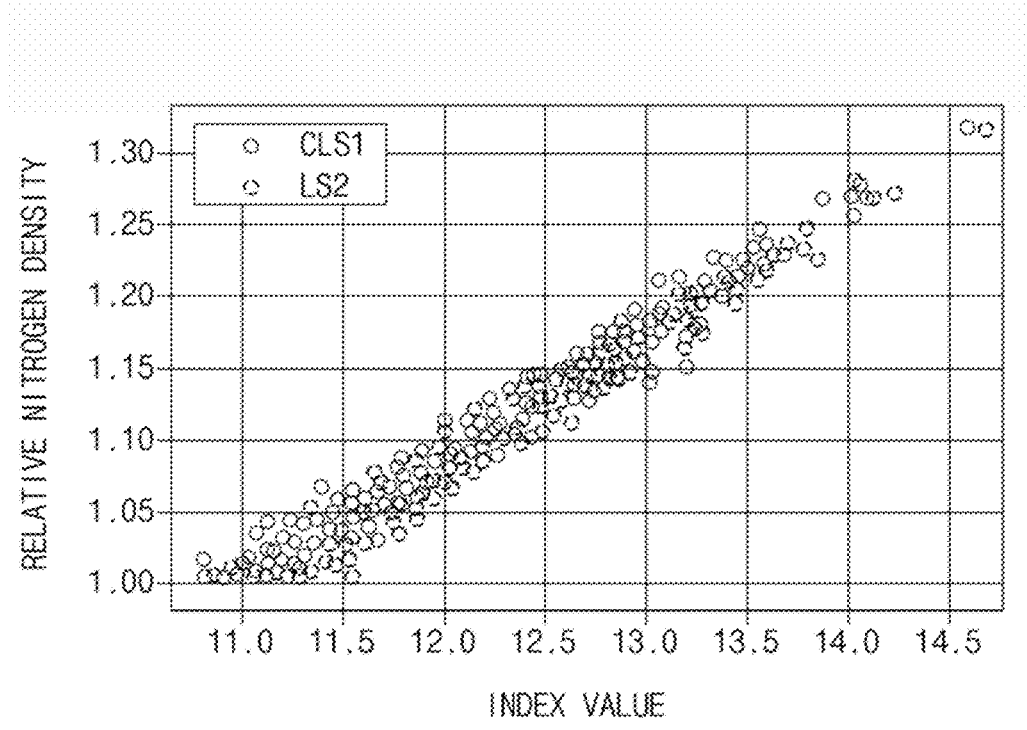

As illustrated in FIG. 5D, the relative nitrogen density of the first light spectrum LS1 may be corrected based on the reflectance for each wavelength of the reflection mirror 200 and the second light spectrum LS2. The relative nitrogen density of the corrected first light spectrum CLS1 may reflect the sensitivity for each wavelength of each of the plurality of optical fibers 110 and the light analyzer 400.

The light analyzer 400 may correct the light spectrum based on the third reflected light RL3 reflected from the view window 24. The light analyzer 400 may correct the light spectrum based on the third reflected light RL3 reflected from the deposition material M formed on the view window 24. The light analyzer 400 may perform the spectral reflectometry calibration through the third reflected light RL3 reflected from the view window 24.

The light analyzer 400 may obtain the reflectance and the transmittance of the view window 24 from the third reflected light RL3. The light analyzer 400 may correct the light spectrum through the reflectance and the transmittance of the view window 24.

The light analyzer 400 may obtain the first light spectrum LS1 from the first light L1. The light analyzer 400 may obtain the third light spectrum LS3 from the third reflected light RL3. When the light generator 300 generates the third light L3, the light analyzer 400 may obtain first data that has both the first light spectrum LS1 and the third light spectrum LS3. When the light generator 300 stops generation of the third light L3, the light analyzer 400 may obtain second data that has the first light spectrum LS1. The light analyzer 400 may correct signal distortion through a difference between the first data and the second data. In this case, the light generator 300 may turn on/off the generation of the third light L3.

Figure 6A:
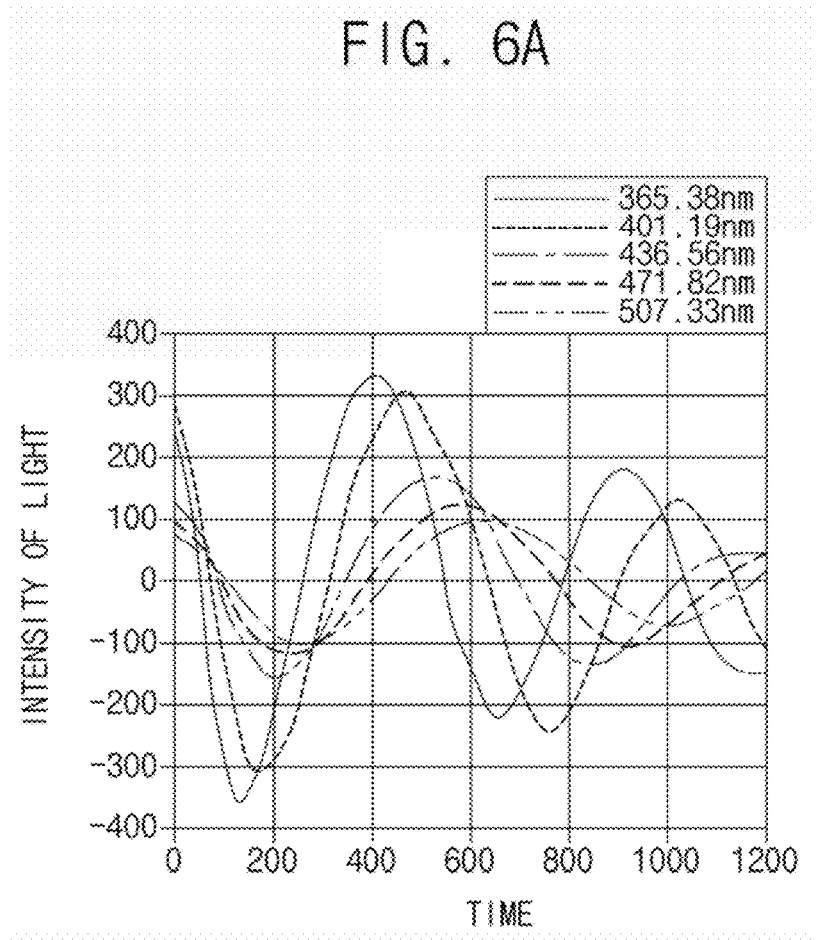

As illustrated in FIG. 6A, the first light spectrum LS1 may be obtained within various wavelength ranges. The third light spectrum LS3 may be obtained by changing the predetermined wavelength from the light generator 300. The first and third light spectrums LS1 and LS3 may have intensities according to the predetermined wavelength, respectively.

The intensities of the first and third light spectrums LS1 and LS3 may decrease as time passes. As the time passes, the state of the view window 24 may be changed. The intensities of the first and third light spectrums LS1 and LS3 may decrease as the time passes.

Figure 6B:
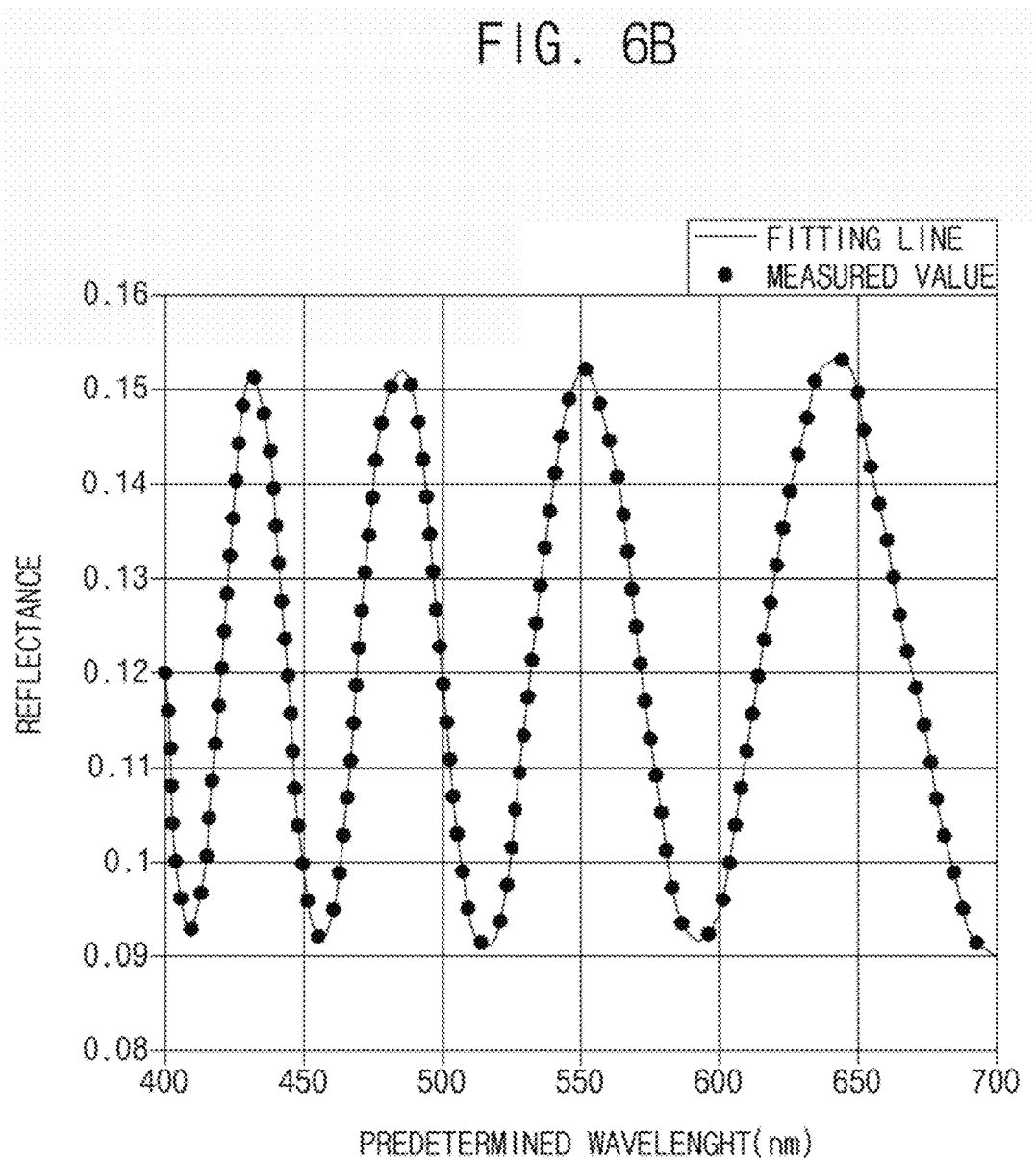

As illustrated in FIG. 6B, the third light spectrum LS3 may have the reflectance according to the wavelength. The reflectance may be referred to as a reflection amount to which the third reflected light RL3 is reflected by the view window 24. The reflectance may be referred to as a reflection amount to which the view window 24 reflects the light. The reflectance may vary according to the wavelength of the third light L3. A fitting line may be drawn through measured values of the wavelength of the third reflected light RL3 on a graph. A change in the reflectance may be calculated through the fitting line.

Figure 6C:
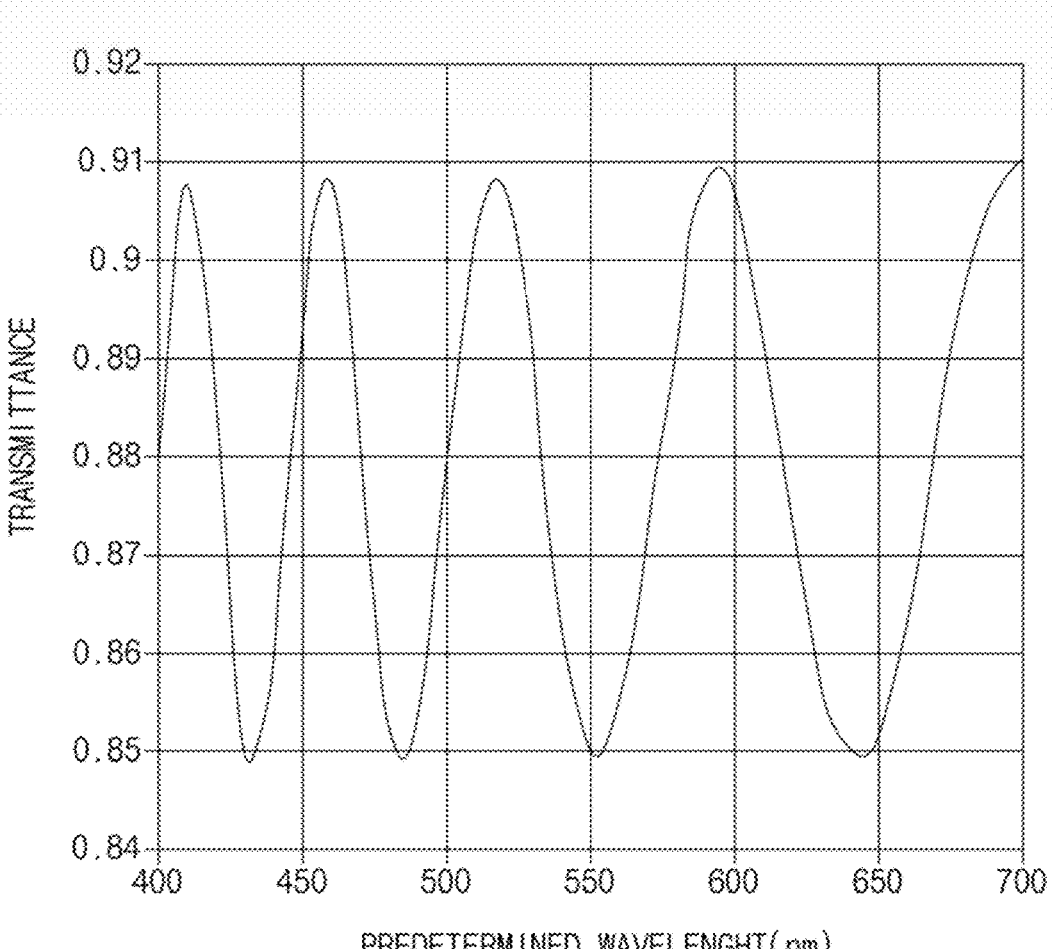

As illustrated in FIG. 6C, the transmittance of the third light L3 may be obtained from the reflectance of the third light spectrum LS3. The transmittance may be a passage amount through which the third light L3 passes through the view window 24, e.g., an amount of the third light L3 that passes through the view window 24. The transmittance may be a passage amount through which the view window 24 transmits the light. The transmittance may have an inverse proportion to the reflectance of the third light spectrum LS3. The transmittance may vary according to the wavelength of the third light L3.

Figure 6D:
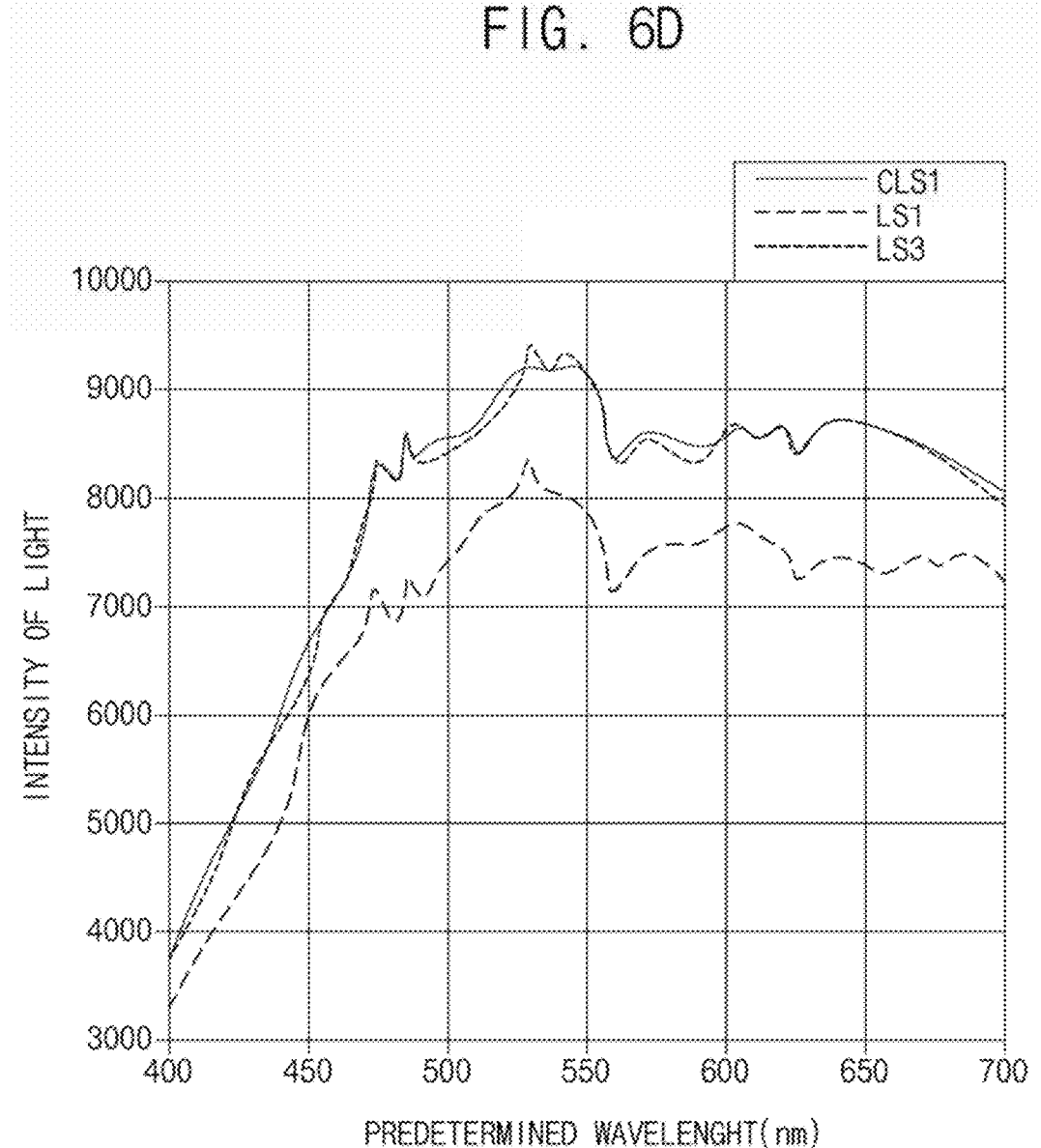

As illustrated in FIG. 6D, the first light spectrum LS1 may be corrected based on the reflectance and the transmittance for each wavelength of the view window 24. The corrected first light spectrum CLS1 may reflect the reflectance and the transmittance of the view window 24.

The light analyzer 400 may correct the light spectrum obtained from the first light L1 based on the third reflected light RL3 that is reflected from the view window 24 in real time during the plasma process.

The light analyzer 400 may map the state of the plasma P to correspond to positions of the plurality of optical fibers 110. The light analyzer 400 may classify the light spectrums LS1, LS2, and LS3 obtained from each of the plurality of optical fibers 110, respectively. The light analyzer 400 may determine the positions corresponding to the light spectrums LS1, LS2, and LS3 through the plurality of optical fibers 110.

The light analyzer 400 may analyze the state of the plasma P from the light spectrums. The light analyzer 400 may store the state of the plasma P corresponding to the positions of the plurality of optical fibers 110. The light analyzer 400 may store the mapped state of the plasma P according to the time to form a database. The light analyzer 400 may compare the state of the plasma obtained in real time with the database.

For example, the light analyzer 400 may be a computing device, e.g., a workstation computer, a desktop computer, a laptop computer, a tablet computer, or the like, and may be implemented as a simple controller, a complex processor, e.g., a microprocessor, a central processing unit (CPU), a graphics processing unit (GPU) etc., or a processor composed of software, dedicated hardware or firmware, or the like. For example, operations of the light analyzer 400 may be implemented as commands stored on a machine-readable medium, e.g., a non-transitory computer-readable medium, that is readable and executable by one or more processors. The computer-readable medium may be a volatile or nonvolatile memory or other storage device, which may be removably or fixedly coupled to the computer, processor, or controller which is to execute the code or instructions for performing the method embodiments described herein.

As described above, the plasma monitoring system 10 may obtain the light spectrum through the first light L1 that is generated from the plasma P through the plasma process. The light spectrum may be corrected through the sensitivity for each wavelength of each of the plurality of optical fibers 110 that is obtained from the second reflected light RL2, and the light analyzer 400. The light spectrum may be corrected in real time during the plasma process through the reflectance and the transmittance of the view window 24 that are obtained from the third reflected light RL3. The light spectrum may reflect an error that is caused by the deposition material formed on the view window 24 through the third reflected light RL3. The plasma monitoring system 10 may correct the light spectrum using same (e.g., conventional) plasma processing apparatus without changing process equipment (e.g., may implement a non-invasive system that is completely external to the plasma processing apparatus and the chamber 20, and operates through the view window 24 while maintaining the chamber 20 and the plasma processing apparatus unchanged).

Also, the plasma monitoring system 10 may perform spectrum analysis for each region through the lights that are obtained in different regions on the view window 24 through the plurality of optical fibers 110. The arrangement of the plurality of optical fibers 110 may be changed according to facilities, processes, and view window characteristics, and monitoring effect may be maximized.

Hereinafter, a method of monitoring plasma using the plasma monitoring system will be described with reference to FIG. 7. FIG. 7 is a flowchart illustrating a method of monitoring plasma in accordance with example embodiments.

First, referring to FIGS. 1 to 7, the first light L1 generated from the plasma process in the chamber 20 may be received through the view window 24 to obtain a light spectrum (S110). The first light L1 may be transmitted through the view window 24 and through the plurality of optical fibers 110 toward the light analyzer 400, which obtains the first light spectrum LS1 from the first light L1.

In example embodiments, the method may correct in real-time the first light spectrum LS1 obtained from the first light L1 through second and third lights L2 and L3 that are generated from a light generator 300. The method may include flux calibration, spectral reflectometry calibration, and the like with respect to the light spectrum.

The view window 24 may be provided on the side wall 22 of the chamber 20 in which the plasma process is performed. The view window 24 may be provided to transmit light, and an internal space of the chamber 20 may be recognized from an outside through the view window 24. The first light L1 generated in the chamber 20 through the plasma process may pass through the view window 24.

Then, the second reflected light RL2 reflected from the reflection mirror 200 provided on the view window 24 may be received through the plurality of optical fibers 110 (S120). That is, the second light R2 (e.g., generated by the light generator 300 to be incident on the reflection mirror 200) is reflected from the reflection mirror 200 (provided between the view window 24 and the plurality of optical fibers 110) as the second reflected light RL2 to be transmitted to the light analyzer 400 through the plurality of optical fibers 110.

The second light L2 may be irradiated onto the reflection mirror 200 from outside of the chamber 20. The reflection mirror 200 may be disposed on the view window 24 in a process of performing the flux calibration, and the reflection mirror 200 may be detached from the view window 24 in a process of performing the spectral reflectometry calibration.

Then, the third reflected light RL3 reflected from the view window 24 may be received through the plurality of optical fibers 110 (S130). That is, the third light R3 (e.g., generated by the light generator 300 to be incident on the reflection mirror 200) is reflected from the reflection mirror 200 (provided between the view window 24 and the plurality of optical fibers 110) as the third reflected light RL3 to be transmitted to the light analyzer 400 through the plurality of optical fibers 110.

In example embodiments, the third light L3 may be irradiated onto the view window 24 from outside of the chamber 20. The third light L3 may pass through the view window 24, and may be reflected from an inner surface of the view window 24. The third light L3 may be reflected from the deposition material M formed on the inner surface of the view window 24 during plasma processing.

Then, the light spectrum may be corrected through the reflected second and third lights RL2 and RL3 (S140). In example embodiments, the first light spectrum LS1 of the first light L1 may be corrected through the light analyzer 400 based on the second and third reflected lights RL2 and RL3.

The light spectrum of the first light L1 may be corrected based on a reflectance of each wavelength of the reflection mirror 200 and the second reflected light RL2. The light spectrum corrected through the second reflected light RL2 may reflect sensitivity for each wavelength of the plurality of optical fibers 110 and the light analyzer 400.

The light spectrum of the first light L1 may be corrected based on the third reflected light RL3 reflected from the view window 24. The first light spectrum LS1 of the first light L1 may be corrected based on the third reflected light RL3 reflected from the deposition material M formed on the view window 24. The light spectrum corrected through the third reflected light RL3 may reflect a reflectance and a transmittance of the view window 24. The light spectrum may be corrected in real time through the third reflected light RL3 while the plasma process is performed.

By way of summation and review, example embodiments provide a plasma monitoring system for improving reliability of plasma state determination while using a same plasma processing apparatus. Example embodiments also provide a method of monitoring plasma using the plasma monitoring system.

That is, according to example embodiments, a plasma monitoring system may include a chamber providing a space configured to perform a plasma process on a semiconductor substrate, the chamber including a view window and a substrate stage configured to support the semiconductor substrate, a light transmitter provided on the view window, the light transmitter including a plurality of optical fibers that are configured to obtain first light that is generated during the plasma process, a reflection mirror provided detachably between the view window and the plurality of optical fibers, a light generator configured to irradiate a second light onto the reflection mirror through the plurality of optical fibers and to irradiate a third light onto the view window through the plurality of optical fibers, and a light analyzer configured to obtain a light spectrum from the first light, to correct the light spectrum based on the second light reflected from the reflection mirror and to correct the light spectrum based on the third light reflected from the view window.

Thus, the plasma monitoring system may obtain the light spectrum through the first light that is generated from plasma through the plasma process. The light spectrum may be corrected through sensitivity for each wavelength of each of the plurality of optical fibers that is obtained from the reflected second light, and the light analyzer. The light spectrum may be corrected in real time during the plasma process through reflectance and transmittance of the view window that are obtained from the reflected third light. The light spectrum may reflect an error that is caused by a deposition material formed on the view window through the reflected third light. The plasma monitoring system may correct the light spectrum using conventional plasma processing apparatus without changing process equipment.

Also, the plasma monitoring system may perform spectrum analysis for each region through lights that are obtained in different regions on the view window through the plurality of optical fibers. Arrangement of the plurality of optical fibers may be changed according to facilities, processes, and view window characteristics, and monitoring effect may be maximized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A plasma monitoring system, comprising:
a chamber with an internal space configured to perform a plasma process on a semiconductor substrate, the chamber including a view window and a substrate stage;
a light transmitter on the view window, the light transmitter including a plurality of optical fibers configured to obtain a first light that is generated during the plasma process;
a reflection mirror between the view window and the plurality of optical fibers, the reflection mirror being detachable from the view window;
a light generator configured
to irradiate a second light onto the reflection mirror through the plurality of optical fibers, and
to irradiate a third light onto the view window through the plurality of optical fibers with the reflection mirror in a detached configuration; and
a light analyzer configured to obtain a light spectrum from the first light, to correct the light spectrum based on the second light reflected from the reflection mirror through the plurality of optical fibers, and to correct the light spectrum based on the third light reflected from the view window through the plurality of optical fibers.

2. The plasma monitoring system as claimed in claim 1, wherein the view window is on a side wall of the chamber.

3. The plasma monitoring system as claimed in claim 1, wherein the light analyzer is configured to obtain sensitivity for each wavelength of each of the plurality of optical fibers and for the light analyzer from the second light reflected from the reflection mirror.

4. The plasma monitoring system as claimed in claim 3, wherein the light analyzer is configured to correct the light spectrum through the sensitivity for each wavelength of each of the plurality of optical fibers and the light analyzer.

5. The plasma monitoring system as claimed in claim 1, wherein the light analyzer is configured to obtain reflectance and transmittance of the view window from the third light reflected from the view window.

6. The plasma monitoring system as claimed in claim 5, wherein the light analyzer is configured to correct the light spectrum through the reflectance and the transmittance of the view window.

7. The plasma monitoring system as claimed in claim 1, wherein the light analyzer is configured to correct the light spectrum based on the third light reflected from the view window, the view window including a deposition material.

8. The plasma monitoring system as claimed in claim 1, wherein:
the reflection mirror is on the view window when the second light is irradiated from the light generator, and
the reflection mirror is detached from the view window when the third light is irradiated from the light generator.

9. The plasma monitoring system as claimed in claim 1, wherein the light analyzer is configured to correct the light spectrum obtained from the first light based on the third light reflected from the view window in real time during the plasma process.

10. The plasma monitoring system as claimed in claim 1, wherein the plurality of optical fibers are spaced apart from each other on the view window.

11. A plasma monitoring system, comprising:
a chamber with an internal space configured to perform a plasma process on a semiconductor substrate, the chamber including a view window and a substrate stage;
a light transmitter on the view window, the light transmitter including a plurality of optical fibers configured to obtain a first light that is generated during the plasma process;
a reflection mirror on the view window, the reflection mirror being detachable from the view window and being configured to transmit the first light that is incident from the view window;
a light generator configured
to irradiate a second light onto the reflection mirror through the plurality of optical fibers, and
to irradiate a third light onto the view window through the plurality of optical fibers with the reflection mirror in a detached configuration; and
a light analyzer configured to obtain a light spectrum from the first light, to correct the light spectrum based on the second light reflected from the reflection mirror through the plurality of optical fibers, and to correct the light spectrum in real time during the plasma process based on the third light reflected from the view window through the plurality of optical fibers.

12. The plasma monitoring system as claimed in claim 11, wherein the view window is on a side wall of the chamber.

13. The plasma monitoring system as claimed in claim 11, wherein the light analyzer is configured to obtain sensitivity for each wavelength of each of the plurality of optical fibers and for the light analyzer from the second light reflected from the reflection mirror.

14. The plasma monitoring system as claimed in claim 13, wherein the light analyzer is configured to correct the light spectrum through the sensitivity for each wavelength of each of the plurality of optical fibers and the light analyzer.

15. The plasma monitoring system as claimed in claim 11, wherein the light analyzer is configured to obtain reflectance and transmittance of the view window from the third light reflected from the view window.

16. The plasma monitoring system as claimed in claim 15, wherein the light analyzer is configured to correct the light spectrum through the reflectance and the transmittance of the view window.

17. The plasma monitoring system as claimed in claim 11, wherein the light analyzer is configured to correct the light spectrum based on the third light reflected from the view window, the view window including a deposition material.

18. The plasma monitoring system as claimed in claim 11, wherein:

the reflection mirror is on the view window when the second light is irradiated from the light generator, and the reflection mirror is detached from the view window when the third light is irradiated from the light generator.

19. The plasma monitoring system as claimed in claim 11, wherein the plurality of optical fibers are spaced apart from each other on the view window.

20. A plasma monitoring system, comprising:

a chamber with an internal space configured to perform a plasma process on a semiconductor substrate, the chamber including a view window and a substrate stage;

a reflection mirror on the view window, the reflection mirror being detachable from the view window and being configured to transmit a first light that is generated during the plasma process and is incident from the view window;

a light generator configured to irradiate a second light onto the reflection mirror through a plurality of optical fibers, and to irradiate a third light onto the view window through the plurality of optical fibers with the reflection mirror in a detached configuration; and an optical scanner configured to scan the first light through the reflection mirror, the second light reflected from the reflection mirror and the third light reflected from an inner surface of the view window, through the plurality of optical fibers; and a spectrometer configured to obtain light spectrums from the first light, the second light reflected from the reflection mirror and the third light reflected from the view window.

\* \* \* \* \*